(12) United States Patent
Kim et al.

(10) Patent No.: US 11,372,050 B2
(45) Date of Patent: Jun. 28, 2022

(54) APPARATUS AND METHOD FOR ESTIMATING STATE OF CHARGE OF SECONDARY BATTERY

(71) Applicant: LG CHEM, LTD., Seoul (KR)

(72) Inventors: Young-Jin Kim, Daejeon (KR); Sun-Young Cha, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 197 days.

(21) Appl. No.: 16/640,184

(22) PCT Filed: Sep. 9, 2018

(86) PCT No.: PCT/KR2018/011072
§ 371 (c)(1),
(2) Date: Oct. 21, 2020

(87) PCT Pub. No.: WO2019/074221
PCT Pub. Date: Apr. 18, 2019

(65) Prior Publication Data
US 2021/0055348 A1    Feb. 25, 2021

(30) Foreign Application Priority Data

Oct. 10, 2017   (KR) .................... 10-2017-0129133

(51) Int. Cl.
*G01R 31/367*   (2019.01)
*G01R 31/374*   (2019.01)
(Continued)

(52) U.S. Cl.
CPC ......... *G01R 31/367* (2019.01); *G01R 31/374* (2019.01); *G01R 31/388* (2019.01); *G01R 31/3842* (2019.01); *G01R 31/3648* (2013.01)

(58) Field of Classification Search
CPC ............... G01R 31/367; G01R 31/374; G01R 31/3842; G01R 31/388; G01R 31/3648
See application file for complete search history.

(56) References Cited

U.S. PATENT DOCUMENTS

| 6,441,586 B1 | 8/2002 | Tate, Jr. et al. |
| 2007/0139013 A1 | 6/2007 | Seo et al. |

(Continued)

FOREIGN PATENT DOCUMENTS

| CN | 103675683 A | 3/2014 |
| CN | 104122504 A | 10/2014 |

(Continued)

OTHER PUBLICATIONS

Hu et al., "Comparison between two model-based algorithms for Li-ion battery SOC estimation in electric vehicles" Simulation Modelling Practice and Theory 34 (2013) 1-11 (Year: 2013).*

(Continued)

*Primary Examiner* — John C Kuan
(74) *Attorney, Agent, or Firm* — Morgan, Lewis & Bockius LLP

(57) ABSTRACT

Provided is an apparatus and method for estimating a state of charge of a secondary battery. The apparatus includes a sensor unit configured to measure a voltage and a current of the secondary battery in a predetermined cycle, and a control unit operably coupled to the sensor unit. The control unit is configured to estimate the state of charge of the secondary battery in the predetermined cycle based on the voltage and the current measured by the sensor unit. The control unit is further configured to determine an operating state of the secondary battery as any one of a linear operating state and a non-linear operating state based on a threshold voltage and the measured voltage, and then determine first process noise indicating inaccuracy of a current integration model and (Continued)

second process noise indicating inaccuracy of an equivalent circuit model according to the determined operating state.

19 Claims, 7 Drawing Sheets

(51) Int. Cl.
*G01R 31/3842* (2019.01)
*G01R 31/388* (2019.01)
*G01R 31/36* (2020.01)

(56) References Cited

U.S. PATENT DOCUMENTS

| | | |
|---|---|---|
| 2007/0299620 A1 | 12/2007 | Yun et al. |
| 2009/0326842 A1 | 12/2009 | Thomas-Alyea |
| 2010/0283471 A1 | 11/2010 | Lim et al. |
| 2013/0341923 A1* | 12/2013 | Ju .................. H01M 10/42 320/112 |
| 2014/0218040 A1 | 8/2014 | Kim |
| 2014/0236511 A1 | 8/2014 | Kulkarni et al. |
| 2015/0231986 A1 | 8/2015 | Li |
| 2016/0025814 A1 | 1/2016 | Ide et al. |
| 2016/0252583 A1 | 9/2016 | Joe |
| 2017/0199247 A1 | 7/2017 | Joe |
| 2017/0200994 A1* | 7/2017 | Kim .................. G01R 31/392 |
| 2017/0242078 A1 | 8/2017 | Kuper et al. |
| 2018/0090962 A1 | 3/2018 | Cha et al. |
| 2018/0284194 A1* | 10/2018 | Andersson ......... G01R 31/3842 |

FOREIGN PATENT DOCUMENTS

| | | |
|---|---|---|
| CN | 104573401 A | 4/2015 |
| CN | 105116346 A | 12/2015 |
| IN | 201817004020 | 6/2018 |
| JP | 2017-036950 A | 2/2017 |
| KR | 10-2007-0006953 A | 1/2007 |
| KR | 10-0669476 B1 | 1/2007 |
| KR | 10-2008-0000160 A | 1/2008 |
| KR | 10-2009-0077656 A | 7/2009 |
| KR | 10-2012-0028000 A | 3/2012 |
| KR | 10-2014-0082752 A | 7/2014 |
| KR | 10-2014-0099372 A | 8/2014 |
| KR | 10-2015-0043216 A | 4/2015 |
| KR | 10-2015-0048439 A | 5/2015 |
| KR | 10-2016-0037830 A | 4/2016 |
| KR | 10-2016-0048666 A | 5/2016 |
| KR | 10-2016-0072410 A | 6/2016 |
| KR | 10-2017-0056301 A | 5/2017 |
| WO | 2016/147722 A | 9/2016 |

OTHER PUBLICATIONS

Extended European Search Report issued in corresponding European Patent Application No. EP 18865431.3, dated Jun. 9, 2020. Note: US 2017/019924, US 2007/0139013, and "Extended Kalman filtering . . . " cited therein were cited previously.
Office Action dated Sep. 29, 2020, issued in corresponding Japanese Patent Application No. 2019-556250.
Office Action dated Jul. 20, 2020, issued in corresponding Korean Patent Application No. 10-2017-0129133.
International Search Report issued in corresponding International Patent Application No. PCT/KR2018/011072, dated Feb. 1, 2019.
Plett,"Extended Kalman filtering for battery management systems of LiPB-based HEV battery packs," Journal of Power Sources, 134: 252-261 (2004).
Office Action dated Apr. 1, 2021, issued in corresponding Chinese Patent Application No. 201880026728.8.

* cited by examiner

APPARATUS AND METHOD FOR ESTIMATING STATE OF CHARGE OF SECONDARY BATTERY

TECHNICAL FIELD

The present disclosure relates to an apparatus and method for estimating the state of charge of a secondary battery using the Extended Kalman Filter.

The present application claims priority to Korean Patent Application No. 10-2017-0129133 filed in the Republic of Korea on Oct. 10, 2017, the disclosure of which is incorporated herein by reference.

BACKGROUND ART

Secondary batteries can be repeatedly charged and discharged, and thus they are used as a source of power in various fields.

For example, secondary batteries are used in handheld devices such as mobile phones, laptop computers, digital cameras, video cameras, tablet computers and electric tools.

Furthermore, secondary batteries are used in various types of electric powered devices including e-bikes, electric motorcycles, electric vehicles, hybrid electric vehicles, electric ship and electric aircraft.

In addition, the range of application of secondary batteries is gradually extending to power storage systems used to store power generated through new renewable energy or redundant power or Uninterruptible Power Systems (UPSs) to stably supply power to various types of information communication devices including base stations for communication with server computers.

The State Of Charge (SOC) of a secondary battery refers to a relative ratio of the current remaining capacity to the capacity when the battery is fully charged, and it is indicated in percentage or a number between 0 and 1.

The SOC indicates an amount of energy left in the secondary battery, so it is a parameter which is absolutely necessary when controlling the charge and discharge of the secondary battery. At 100% SOC, it is necessary to stop charging, and at 0% SOC, it is necessary to stop discharging. Additionally, the SOC is also used when controlling the output of the secondary battery or estimating the State Of Health of the secondary battery.

The SOC may be estimated by the current integration method (also known as Ampere counting). Here, the Ampere counting determines the SOC by integrating the charge current and the discharge current over time. However, because there is a difference between the current measured by a current sensor and the actual current, the SOC estimated using Ampere counting alone has lower accuracy over time.

In addition to Ampere counting, there are algorithms using an Equivalent Circuit Model (ECM) designed to simulate the electrical and chemical properties of secondary batteries, and one of them is the extended Kalman filter. The extended Kalman filter is a probability and statistical technique that estimates the internal state of a system using measurable parameters.

However, the extended Kalman filter gradually reduces in accuracy as a secondary battery degrades. For example, an equivalent circuit model of the extended Kalman filter includes parameters related to the capacity and resistance of the secondary battery, and it is difficult to appropriately update the parameters of the equivalent circuit model due to the reduced capacity and the increased resistance caused by degradation of the secondary battery.

Additionally, because the equivalent circuit model of the extended Kalman filter is designed to simulate the linear operational characteristics of the secondary battery, it is very difficult to design the equivalent circuit model to accurately simulate the non-linear operational characteristics of the secondary battery.

DISCLOSURE

Technical Problem

The present disclosure is designed under the background of the related art as described above, and therefore the present disclosure is directed to providing an apparatus and method for estimating the state of charge of a secondary battery more accurately even in the operating regime in which the secondary battery has the non-linear operational characteristics.

These and other objects and advantages of the present disclosure will be understood by the following description and will be apparent from the embodiments of the present disclosure. Additionally, it will be readily understood that the objects and advantages of the present disclosure are realized by the means set forth in the appended claims and combinations thereof.

Technical Solution

To achieve the above-described technical object, an apparatus for estimating a state of charge of a secondary battery using an extended Kalman filter algorithm according to the present disclosure includes a sensor unit configured to measure a voltage and a current of the secondary battery in a predetermined cycle, and a control unit operably coupled to the sensor unit and configured to estimate the state of charge of the secondary battery in the predetermined cycle based on the voltage and the current measured by the sensor unit by repeatedly executing an extended Kalman filter algorithm using a state equation related to a current integration model and an equivalent circuit model and an output equation related to the equivalent circuit model. The control unit is further configured to determine an operating state of the secondary battery as any one of a linear operating state and a non-linear operating state based on a threshold voltage and the measured voltage. The control unit is further configured to determine a first process noise indicating inaccuracy of the current integration model and a second process noise indicating inaccuracy of the equivalent circuit model according to the determined operating state.

The control unit may be further configured to set the first process noise to a first fixed value and the second process noise to a second fixed value when the operating state of the secondary battery is determined as the linear operating state.

The control unit may be further configured to set the first process noise to the first fixed value and the second process noise to a first corrected value when the operating state of the secondary battery is determined as the non-linear operating state. The first corrected value may be larger than the second fixed value. The control unit may be further configured to determine the first corrected value based on a difference between the measured voltage and the threshold voltage.

The control unit may be further configured to set the first process noise to a second corrected value and the second process noise to the second fixed value when the operating state of the secondary battery is determined as the non-linear operating state. The second corrected value may be smaller than the first fixed value. The control unit may be further configured to determine the second corrected value based on a difference between the measured voltage and the threshold voltage.

The control unit may be further configured to set the first process noise to a third corrected value and the second process noise to a fourth corrected value when the operating state of the secondary battery is determined as the non-linear operating state. The third corrected value may be smaller than the first fixed value, and the fourth corrected value may be larger than the second fixed value. The control unit may be further configured to determine the third corrected value and the fourth corrected value based on a difference between the measured voltage and the threshold voltage.

The apparatus may further include a communication interface configured to transmit data to an external device, the data indicating the state of charge of the secondary battery repeatedly estimated by the control unit.

The sensor unit may be further configured to measure a temperature of the secondary battery in the predetermined cycle. The control unit may be further configured to determine the threshold voltage based on the measured temperature. The threshold voltage is a criterion for distinguishing between the linear operating state and the non-linear operating state. The control unit may be further configured to determine the operating state of the secondary battery as the linear operating state when the measured voltage is higher than the threshold voltage. The control unit may be further configured to determine the operating state of the secondary battery as the non-linear operating state when the measured voltage is lower than the threshold voltage.

Advantageous Effects

According to the present disclosure, it is possible to estimate the state of charge of a secondary battery more accurately even in the operating regime in which the secondary battery has the non-linear operational characteristics.

Additionally, it is possible to perform control using the estimated state of charge to charge and discharge the secondary battery safely.

The effects of the present disclosure are not limited to the effects mentioned above, and these and other effects of the present disclosure will be clearly understood by those skilled in the art from the appended claims.

BRIEF DESCRIPTION OF THE DRAWINGS

The accompanying drawings illustrate an embodiment of the present disclosure, and together with the following detailed description, serve to provide a further understanding of the technical aspects of the present disclosure, and thus, the present disclosure is not construed as being limited to the drawings.

Figure 5:
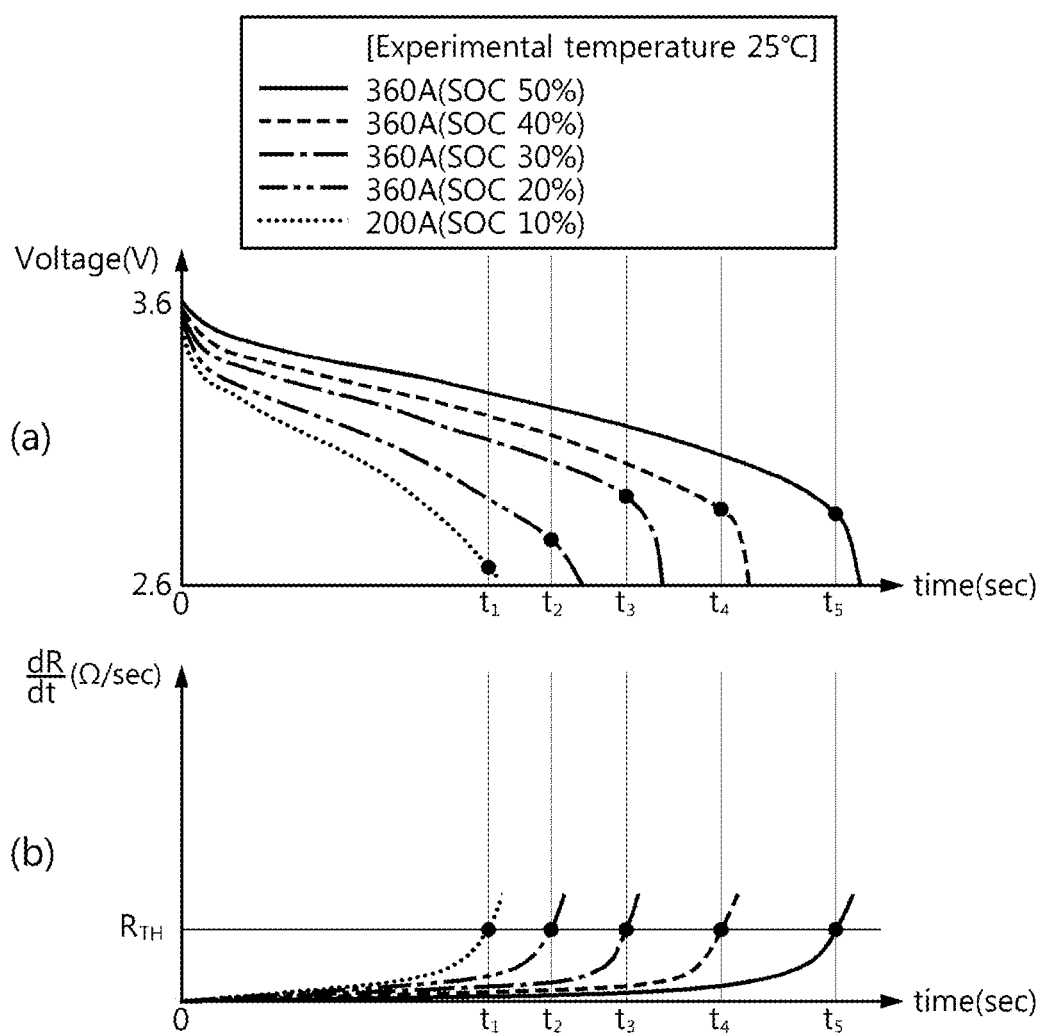

(a) of FIG. 5 is a graph showing discharge profiles obtained through constant current discharge experiments conducted while maintaining the temperature of six secondary batteries at 25° C. with the same maximum capacity of 36 Ah and different SOCs of 10%, 20%, 30%, 40% and 50%, and (b) of FIG. 5 is a graph showing resistance variation profiles obtained from the discharge profiles shown in (a) of FIG. 5.

Figure 6:
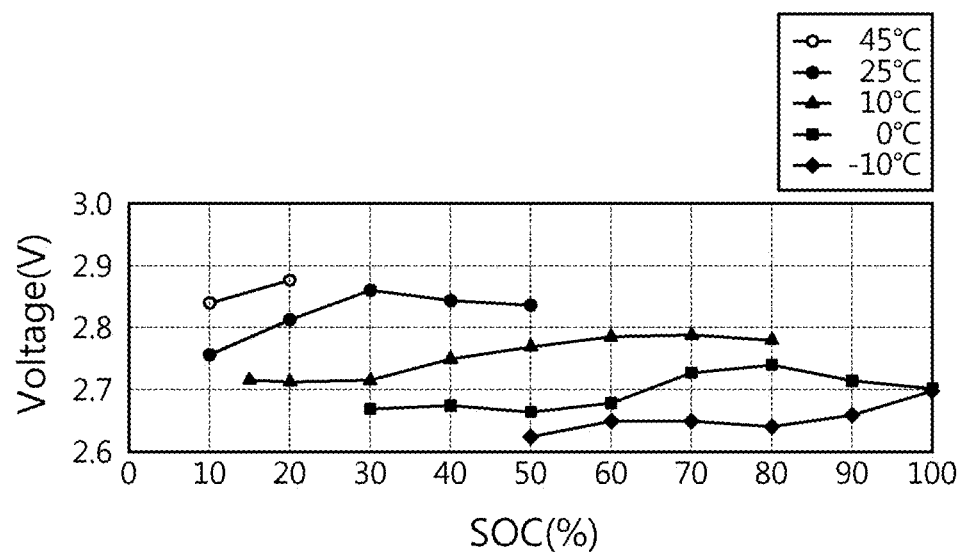

FIG. 6 is a graph showing candidate voltage values determined from discharge profiles and resistance variation profiles obtained under various temperature conditions.

Figure 7:
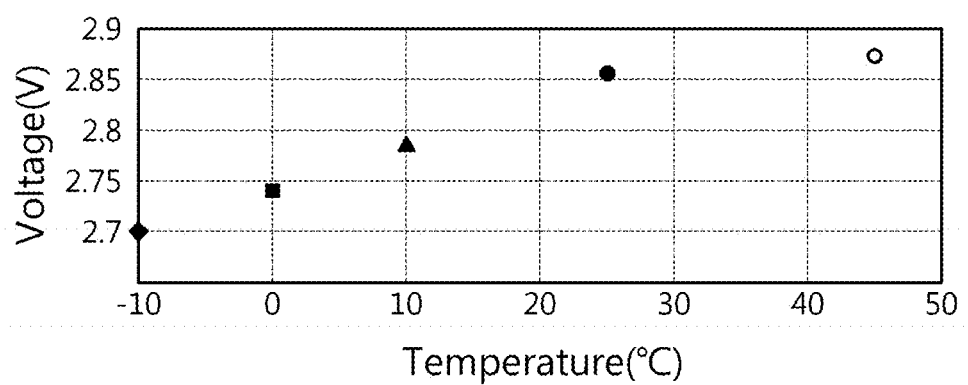

FIG. 7 is a graph showing changes in threshold voltage with changes in temperature condition.

MODE FOR CARRYING OUT THE INVENTION

Hereinafter, the embodiments of the present disclosure will be described with reference to the accompanying drawings. Prior to the description, it should be understood that the terms or words used in the specification and the appended claims should not be construed as limited to general and dictionary meanings, but interpreted based on the meanings and concepts corresponding to the technical aspects of the present disclosure on the basis of the principle that the inventor is allowed to define the terms appropriately for the best explanation. Therefore, the embodiments described herein and illustrations shown in the drawings are just an embodiment of the present disclosure, but not intended to fully describe the technical aspects of the present disclosure, so it should be understood that various other equivalents and modifications could be made thereto at the time the invention was made.

In the embodiments described below, a secondary battery refers to a lithium secondary battery. Here, the lithium secondary battery refers collectively to secondary batteries in which lithium ions act as working ions during charging and discharging, causing electrochemical reactions at the positive electrode and the negative electrode.

Meanwhile, it should be interpreted as that even though the name of the secondary battery changes depending on the type of electrolyte or separator used in the lithium secondary battery, the type of packaging used to package the secondary battery and the internal or external structure of the lithium secondary battery, the lithium secondary battery covers any secondary battery using lithium ions as working ions.

The present disclosure may be also applied to secondary batteries other than lithium secondary batteries. Accordingly, it should be interpreted as that the present disclosure covers any type of secondary battery to which the technical aspects of the present disclosure may be applied, though working ions are not lithium ions.

Additionally, the secondary battery is not limited to the number of elements that constitute the secondary battery. Accordingly, the secondary battery should be interpreted as including a unit cell including an assembly of positive electrode/separator/negative electrode and an electrolyte in a packaging material, as well as an assembly of unit cells, a module including a plurality of assemblies connected in series and/or in parallel, a pack including a plurality of modules connected in series and/or in parallel, a battery system including a plurality of packs connected in series and/or in parallel, or the like.

Figure 1:
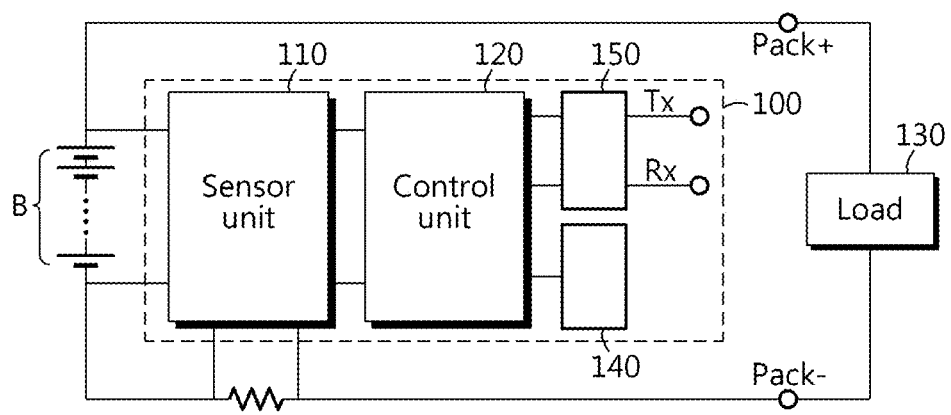
FIG. 1 is a schematic block diagram showing the configuration of an apparatus for estimating the State of Charge (SOC) of a secondary battery according to an embodiment of the present disclosure.

FIG. 1 is a schematic block diagram showing the configuration of an apparatus 100 for estimating the state of charge (SOC) of a secondary battery according to an embodiment of the present disclosure.

As shown in the drawing, the apparatus 100 for estimating the SOC includes a sensor unit 110 and a control unit 120, and is electrically connectable to a secondary battery B to estimate the SOC of the secondary battery B using the extended Kalman filter.

The secondary battery B is electrically connectable to a load 130. The load 130 is included in many electric powered apparatuses, and refers to an energy consuming device included in the electric powered apparatus that operates by electrical energy supplied when the secondary battery B is discharged.

Non-limiting examples of the load 130 may include a rotary power device such as a motor and a power conversion device such as an inverter, but the present disclosure is not limited by the type of the load 130.

The apparatus 100 may further include a storage unit 140. The storage unit 140 is not limited to a particular type and includes any storage media capable of recording and erasing information.

For an example, the storage unit 140 may be RAM, ROM, register, hard disk, optical recording media or magnetic recording media.

The storage unit 140 may be connected to the control unit 120, for example, through a data bus, to allow the control unit 120 to access it.

The storage unit 140 stores and/or updates and/or erases and/or transmits programs including various types of control logics executed by the control unit 120, and/or data created when the control logics are executed.

The storage unit 140 may be logically split into two or more, and may be included in the control unit 120, but is not limited thereto.

The sensor unit 110 is operably coupled to the control unit 120 to transmit and receive an electrical signal to/from the control unit 120.

The sensor unit 110 measures, under the control by the control unit 120, the voltage applied between the positive electrode and the negative electrode of the secondary battery B and the current flowing in and out of the secondary battery B repeatedly in a predetermined cycle, and provides the control unit 120 with a signal indicating the measured voltage and a signal indicating the measured current. Here, the voltage and the current may be measured at the same point in time or different points in time. The sensor unit 110 may measure the temperature of the secondary battery B in a predetermined cycle, and provide a signal indicating the measured temperature to the control unit 120.

The sensor unit 110 may include a voltage measuring unit to measure the voltage of the secondary battery B, and a current measuring unit to measure the current of the secondary battery B.

The voltage measuring unit may include a voltage measuring circuit commonly used in the art. The current measuring unit may include a hall sensor or a sense resistor commonly used in the art. However, the present disclosure is not limited thereto.

The sensor unit 110 refers to a functional block that measures the voltage and current of the secondary battery B, and thus it is obvious to those skilled in the art that the voltage measuring component and the current measuring component may be physically separated from each other.

The control unit 120 is a component that may execute at least one control logic necessary to estimate the SOC of the secondary battery B in the predetermined cycle using the extended Kalman filter. The control unit 120 may estimate the SOC of the secondary battery B using the extended Kalman filter algorithm predefined as software as a non-limiting example.

To utilizing the extended Kalman filter when estimating the state of charge of the secondary battery B, it is necessary to define a state equation and an output equation in which the secondary battery B is regarded as a system.

The state equation and the output equation may be derived from an equivalent circuit model.

Figure 2:
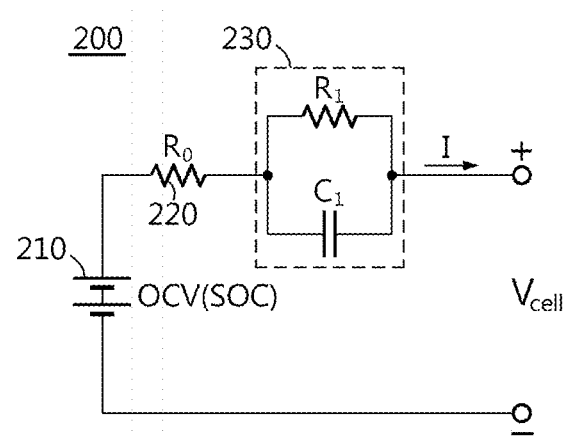
FIG. 2 is an exemplary diagram showing an equivalent circuit model related to the extended Kalman filter algorithm used for SOC estimation shown in FIG. 1.

FIG. 2 is an exemplary diagram showing the equivalent circuit model 200 related to the extended Kalman filter algorithm used for SOC estimation shown in FIG. 1.

Referring to FIG. 2, the equivalent circuit model 200 includes an open voltage source 210 with voltage values changing depending on the SOC of the secondary battery B. The open-circuit voltage (OCV) of the open voltage source 210 changes depending on SOC, and may be defined as a function such as OCV=f(SOC) by the equivalent circuit model 200. Alternatively, the OCV of the open voltage source 210 changes depending on SOC and temperature in combination, and may be defined as a function such as OCV=f(SOC, T) by the equivalent circuit model 200. The 'T' denotes the temperature of the secondary battery B.

The open voltage source 210 simulates the OCV when the secondary battery B is electrochemically stable for a long time.

The OCV formed by the open voltage source 210 may be predefined for each SOC through experiments.

That is, the OCV of another secondary battery designed to have the same electrical and chemical properties as the secondary battery B is measured at various SOCs and various temperatures. Subsequently, a correlation between OCV and SOC may be defined in the form of a function or a lookup table by interpreting the measured data.

The equivalent circuit model 200 may further include a direct current resistor 220 that simulates the internal resistance of the secondary battery B. The direct current resistor 220 simulates the internal resistance voltage created by the internal resistance when the secondary battery B is charged or discharged.

In the corresponding technical field, the internal resistance voltage is referred to as IR voltage. Due to the IR voltage, voltage across two ends measured during charging is larger than OCV. On the contrary, voltage across two ends measured during discharging is smaller than OCV. The resistance value $R_0$ of the direct current resistor 220 may be preset through experimentation.

The equivalent circuit model 200 may include at least one RC circuit 230 that simulates the polarization voltage of the secondary battery B. The RC circuit 230 includes at least one resistor $R_1$ and at least one condenser $C_1$ connected to the resistor $R_1$ in parallel.

The polarization voltage is voltage resulting from polarization accumulated at the positive electrode and the negative electrode when the secondary battery B is charged or discharged. The resistance value $R_1$ and capacitance $C_1$ of the RC circuit 230 may be preset through experimentation.

The state equation and the output equation of the extended Kalman filter according to the present disclosure are derived from the equivalent circuit model 200 described above.

The extended Kalman filter is an Adaptive Software Algorithm that may estimate the state of a dynamical system using probabilities and statistics, considering externally measurable variables and system disturbances.

The basic principle of the extended Kalman filter is well known in the technical field to which the present disclosure belongs, and for example, a reference may be made to Gregory L. Plett's essay "Extended Kalman filtering for battery management systems of LiPB-based HEV battery packs Part 1. Background" (Journal of Power Source 134, 2004, 252-261), the disclosure of which may be incorporated herein for reference.

In the present disclosure, the state equation of the extended Kalman filter includes the SOC of the secondary battery and the polarization voltage of the secondary battery as state variables, and updates the state variables over time.

In detail, the state equation may include the following two equations based on the time-discrete model.

$$SOC[k+1] = SOC[k] - \frac{I[k]\Delta t}{Q_{capacity}}$$ Equation 1

$$V_1[k+1] = \exp\left(-\frac{\Delta t}{R_1 C_1}\right) V_1[k] + R_1\left(1 - \exp\left(-\frac{\Delta t}{R_1 C_1}\right)\right) I[k]$$ Equation 2

Equation 1 is a SOC updating equation based on the current integration model, and may be used to time-update the SOC of the secondary battery which is one of the two state variables.

Equation 2 is a polarization voltage updating equation based on the equivalent circuit model 200, and may be used to time-update the other of the two state variables, namely, the polarization voltage of the secondary battery, using the RC circuit 230.

In Equation 1, $Q_{capacity}$ is the maximum capacity of the secondary battery B, k is the time index, I[k] is the current measured at the time index k, SOC[k] is the SOC at the time index k, $\Delta t$ is the time interval at which the time index increases, $R_1$ and $C_1$ are the resistance value and capacitance of the RC circuit 230 included in the equivalent circuit model 200. In Equation 2, $V_1[k]$ is the polarization voltage at the time index k, i.e., the voltage across two ends of the RC circuit 230.

The state equation represented as the above Equations 1 and 2 may be expressed as a vector state equation such as Equation 3 using the matrix.

$$\begin{bmatrix} SOC_{k+1} \\ V_{1,k+1} \end{bmatrix} = \begin{bmatrix} 1 & 0 \\ 0 & \exp\left(-\frac{\Delta t}{R_1 C_1}\right) \end{bmatrix} \begin{bmatrix} SOC_k \\ V_{1,k} \end{bmatrix} + \begin{bmatrix} \frac{\Delta t}{Capacity} \\ R_1\left(1 - \exp\left(-\frac{\Delta t}{R_1 C_1}\right)\right) \end{bmatrix} I_k$$ Equation 3

$SOC_k$, $V_{1,k}$ and $I_k$ in Equation 3 are identical to SOC[k], $V_1[k]$ and I[k] in Equations 1 and 2 respectively. $R_1$, $C_1$ and Capacity (identical to $Q_{capacity}$ in Equation 1) in Equation 3 are electrical property values that may be tuned using Trial & Error method to minimize a state error of the system directly measured through experimentation or estimated by the extended Kalman filter, and they are fixed values or values that change depending on the SOC of the secondary battery B or the SOH of the secondary battery B. Those skilled in the art will easily understand that the state equation according to Equation 3 is related to the current integration model and the equivalent circuit model 200.

In the present disclosure, the output equation of the extended Kalman filter algorithm may be represented as a time-discrete model. That is, the output equation represents the voltage of the secondary battery as an output variable using the OCV corresponding to the SOC of the secondary battery at the time index k, the polarization voltage and the internal resistance voltage generated by the internal resistance of the secondary battery.

In detail, the output equation may be represented as the following Equation 4 at the time index k.

$$V_{cell}[k] = V_{OCV}[k] + V_1[k] + I[k]R_0$$ Equation 4:

In the above Equation 4, $V_{OCV}[k]$ is the OCV of the secondary battery B at the time index k, and is the voltage formed by the open voltage source 210 included in the equivalent circuit model 200. $V_{OCV}[k]$ may be calculated using the function or lookup table that predefines the correlation between SOC and OCV. That is, after SOC is obtained by Equation 1, OCV corresponding to the SOC may be determined using the function or the lookup table.

$I[k]R_0$ is the internal resistance voltage formed across the direct current resistor 220 of the equivalent circuit model 200 when I[k] flows through the secondary battery B, and may be determined using the current value I[k] measured at the time index k and the resistance value $R_0$ of the preset direct current resistor 220.

The control unit 120 may adaptively estimate the SOC of the secondary battery B by repeatedly executing the extended Kalman filter algorithm using the state equation and the output equation described above.

First, the control unit 120 may initialize two state variables, namely, SOC and polarization voltage $V_1$ as follows.

Initialization:

$V_1[0]=0$ $SOC[0]=OCV^{-1}(V_{cell}[0])$

In the above initialization Equation, $V_{cell}[0]$ denotes the initial voltage measured for the first time at the start of charge or discharge of the secondary battery B. Additionally, $OCV^{-1}$ is an inverse of a function that converts SOC to OCV. SOC[0] may be easily calculated from the predefined correlation between SOC and OCV.

In the above initialization Equation, $V_{cell}[0]$ denotes the initial voltage measured for the first time at the start of charge or discharge of the secondary battery B. Additionally, $OCV^{-1}$ is an inverse of a function that converts SOC to OCV. SOC[0] may be easily calculated from the predefined correlation between SOC and OCV.

Here, the predefined correlation may be a lookup table or a lookup function. The lookup table may have a data structure that allows cross reference between SOC and OCV. The lookup function may have a function form that may input one of SOC and OCV as an input variable and output the other as an output variable.

The extended Kalman filter is robust against the initial condition, and thus the initial condition of the state variables is not necessarily limited to a specific condition. Accordingly, the initial condition of the state variables may be arbitrarily set to meet the condition that the system's state estimated by the extended Kalman filter must not diverge.

The control unit 120 may time-update the SOC and the polarization voltage using the state equation of Equations 1 and 2 in each time step, i.e., each time the time index increases by 1. For example, Equations 1 and 2 are expressed as the following Equations 1-1 and 2-1 at k=1.

$$SOC[1] = SOC[0] - \frac{I[0]\Delta t}{Q_{Capacity}}$$ Equation 1-1

-continued $$V_1[1] = \exp\left(-\frac{\Delta t}{R_1 C_1}\right) V_1[0] + R_1\left(1 - \exp\left(-\frac{\Delta t}{R_1 C_1}\right)\right) I[0] \quad \text{Equation 2-1}$$

In Equations 1-1 and 2-1, I[0] is the initial current value measured for the first time by the sensor unit 110.

Additionally, the control unit 120 time-updates the error covariance for the state variables using the following Equation 5. Here, k may be, for example, 1.

$$\Sigma_{\tilde{x},k}^- = \hat{A}_{k-1} \Sigma_{\tilde{x},k-1}^+ \hat{A}_{k-1}^T + \hat{B}_{k-1} \Sigma_{\tilde{\omega}} \hat{B}_{k-1}^T \quad \text{Equation 5}$$

In Equation 5, x is the state variable, k is the time index, w is the process noise of the extended Kalman filter, A and B having the ^ symbol attached to the top are Jacobians obtained from the state equation, and T is the transposed matrix operator. The parameter with sigma denotes the error covariance of the corresponding parameter. The initial value of error covariance, i.e., a value allocated to the error covariance when k−1=0 in Equation 5 may be preset. Additionally, the error covariance having the minus symbol attached thereto denotes the time-updated covariance, and the error covariance having the plus symbol attached thereto denotes the error covariance corrected immediately before.

In Equation 5, when the time index k is 1, the initial value of error covariance for the state variable on the right side may be preset to prevent the divergence of the extended Kalman filter, and preferably may be set to 0.

When the time-updating of the error covariance is completed, the control unit 120 measures current I[1] and voltage V[1] of the secondary battery B using the sensor unit 110, and estimates voltage $V_{cell}[1]$ of the secondary battery B as an output variable by applying the time-updated state variable $V_1[1]$, the measured current I[1] and OCV $V_{OCV}[1]$ corresponding to SOC[1] to Equation 4. That is, $V_{cell}[1]$ is the same as the following Equation 4-1.

$$V_{Cell}[1] = V_{OCV}[1] + V_1[1] + I[1]R_0 \quad \text{Equation 4-1}$$

Subsequently, the control unit 120 determines the Kalman gain $L_k$ when the time index k is 1 by applying the time-updated error covariance to the following equation 6.

$$L_k = \Sigma_{\tilde{x},k}^- \hat{C}_k^T [\hat{C}_k \Sigma_{\tilde{x},k}^- \hat{C}_k^T + \hat{D}_k \Sigma_{\tilde{v}} \hat{D}_k^T]^{-1} \quad \text{Equation 6}$$

In Equation 6, C and D having the ^ symbol attached to the top are Jacobians obtained from the output equation, v is the sensor noise of the extended Kalman filter, and T is the transposed matrix operator.

Subsequently, the control unit 120 estimates the state variable by applying the determined Kalman gain L, the measured voltage V[k] and the time-updated state variable to the following equation to correct the state variable.

$$\hat{x}_k^+ = \hat{x}_k^- + L_k(z_k - \hat{z}_k) \quad \text{Equation 7}$$

In Equation 7, x and z denote the state variable and the output variable respectively, the − symbol denotes that the corresponding state variable is a time-updated state variable, the + symbol denotes that the corresponding state variable is an estimated state variable, z having the ^ symbol attached to the top is the estimated voltage $V_{cell}[k]$ of the secondary battery B, and z having no ^ symbol on the top is the actual measured voltage V[k] of the secondary battery.

The control unit 120 may estimate the SOC of the secondary battery B by extracting the SOC from the state variable estimated by Equation 7.

The control unit 120 corrects the error covariance of the state variable by applying the determined Kalman gain, the Jacobian C and the error covariance of the time-updated state variable to the following Equation 8.

$$\Sigma_{\tilde{x},k}^+ = (I - L_k \hat{C}_k) \Sigma_{\tilde{x},k}^- \quad \text{Equation 8:}$$

A series of calculation processes described above is repeatedly performed each time the time index k increases by 1. Additionally, the state variable estimated by Equation 7 and the error covariance of the state variable corrected by Equation 8 are used when time-updating the state variable and its error covariance in the next calculation cycle.

The control unit 120 may determine whether the secondary battery B entered the non-linear operating state based on the voltage measured by the sensor unit 110 at the latest time index k. That is, the control unit 120 may determine the operating state of the secondary battery B as any one of linear operating state and non-linear operating state based on the voltage measured by the sensor unit 110 at the latest time index k.

Here, the non-linear operating state may refer to an operating state when the voltage of the secondary battery B is equal to or lower than the threshold voltage. On the contrary, the linear operating state may refer to an operating state when the voltage of the secondary battery B is higher than the threshold voltage. The threshold voltage is the criterion for distinguishing between the linear operating state and the non-linear operating state, and may be determined by the control unit 120 based on the latest temperature measured by the sensor unit 110 in a predetermined period of time.

When the secondary battery B is in non-linear operating state, the equivalent circuit model 200 does not provide reliable data enough to estimate the SOC of the secondary battery B. That is, a difference between the polarization voltage represented by $V_1[k]$ of Equation 2 and the actual polarization voltage exceeds the allowable range. In the non-linear operating state, as a difference between the voltage of the secondary battery B and the threshold voltage increases, a difference between the polarization voltage represented by $V_1[k]$ of Equation 2 and the actual polarization voltage may tend to increase as well.

The process noise component of the extended Kalman filter is $\Sigma_{\tilde{\omega}}$ included in the second term of Equation 5 used to time-update the error covariance of the state variable, and may be represented as the following Equation 9.

$$\sum \tilde{w} = \begin{bmatrix} \sigma_{soc}^2 & 0 \\ 0 & \sigma_{V_1}^2 \end{bmatrix} \quad \text{Equation 9}$$

In Equation 9, $\sigma_{soc}^2$ indicates a first process noise, and $\sigma_{V_1}^2$ indicates a second process noise. The first process noise represents inaccuracy of the current integration model, and the second process noise represents inaccuracy of the equivalent circuit model 200. It is desirable to set the first process noise higher as the accuracy of the current integration model is lower. Additionally, it is desirable to set the second process noise higher as the accuracy of the equivalent circuit model 200 is lower.

The equivalent circuit model 200 simulates the actual polarization voltage of the secondary battery B well while the secondary battery B is in linear operating state. However, while the secondary battery B is in non-linear operating state, especially a difference between the polarization voltage from Equation 2 related to the equivalent circuit model 200 and the actual polarization voltage may exceed the allowable range. Accordingly, it is necessary to adjust a ratio between the first process noise and the second process noise according to the operating state of the secondary battery B.

When the secondary battery B is determined to be in non-linear operating state, the control unit 120 changes at least one of the first process noise $\sigma_{soc}^2$ and the second process noise $\sigma_{V1}^2$. In detail, while the secondary battery B is in linear operating state, that is to say, while the secondary battery B is not in non-linear operating state, first and second fixed values are individually set to each of the first process noise and the second process noise. The first and second fixed values are identical or different to each other. The first and second fixed values may be preset. In contrast, while the secondary battery B is in non-linear operating state, at least one of the first and second fixed values is replaced with another value.

In an example, the control unit 120 sets the first process noise as the first fixed value and the second process noise as a first corrected value that is larger than the second fixed value. The control unit 120 may determine the first corrected value based on the difference between the voltage measured by the sensor unit 110 and the threshold voltage. For example, a value obtained by subtracting the second fixed value from the first corrected value may be proportional to a value obtained by subtracting the threshold voltage from the voltage measured at the latest time index k.

In another example, the control unit 120 sets the first process noise as a second corrected value that is smaller than the first fixed value and the second process noise as the second fixed value. The control unit 120 may determine the second corrected value based on the difference between the voltage measured by the sensor unit 110 and the threshold voltage. For example, a value obtained by subtracting the second corrected value from the first fixed value may be proportional to a value obtained by subtracting the threshold voltage from the voltage measured at the latest time index k.

In still another example, the control unit 120 sets the first process noise as a third corrected value that is smaller than the first fixed value and the second process noise as a fourth corrected value that is larger than the second fixed value. The control unit 120 may determine the third corrected value and the fourth corrected value based on the difference between the voltage measured by the sensor unit 110 and the threshold voltage. For example, a value obtained by subtracting the third corrected value from the first fixed value may be proportional to a value obtained by subtracting the threshold voltage from the voltage measured at the latest time index k. Aside from this, a value obtained by subtracting the second fixed value from the fourth corrected value may be proportional to a value obtained by subtracting the threshold voltage from the voltage measured at the latest time index k.

It is expected that an error in SOC estimation that may increase due to inaccuracy of the equivalent circuit model 200 while the secondary battery B is non-linear operating state will be significantly reduced by changing at least one of the first process noise $\sigma_{soc}^2$ and the second process noise $\sigma_{V1}^2$ like the above-described examples.

Additionally, this effect may be maintained even when the parameters of the extended Kalman filter are changed by degradation of the secondary battery.

That is, the apparatus 100 according to the present disclosure is robust against changes in capacity and internal resistance of the secondary battery influenced by degradation of the secondary battery.

Optionally, to further enhance the effect of the present disclosure, the control unit 120 may additionally reduce the magnitude of sensor noise, along with adjusting at least one of the first process noise $\sigma_{soc}^2$ and the second process noise $\sigma_{V1}^2$ included in the process noise component of the extended Kalman filter.

The sensor noise is $\Sigma_{\tilde{v}}$ included in Equation 6 that determines the Kalman gain, and may be represented as the following Equation 10.

$$\Sigma \tilde{v} = (\sigma_v)^2 \qquad \text{Equation 10:}$$

In Equation 10, $\sigma_v^2$ corresponding to the sensor noise is a parameter that may be tuned by trial and error method.

Each time the time index increases, the control unit 120 may transmit data representing the current SOC updated by the extended Kalman filter to an external device (for example, an ECU of an electric vehicle, a graphic user interface) through a communication interface 150.

The control unit 120 may selectively include a processor, an application-specific integrated circuit (ASIC), chipsets, a logic circuit, register, a communication modem and a data processing device known in the art to execute the above-described various control logics. Additionally, when the control logics are implemented in software, the control unit 120 may be implemented as a set of program modules. In this instance, the program module may be stored in the memory and executed by the processor. The memory may be inside or outside the processor, and may be connected to the processor with a variety of known computer components. Additionally, the memory may be included in the storage unit 140 of the present disclosure. Additionally, the memory refers collectively to devices in which information is stored irrespective of the device type, and does not refer to a particular memory device.

It is obvious that the above-described control logics of the control unit 120 may form the processes of the method for estimating the state of a secondary battery according to an embodiment of the present disclosure.

Figure 3:
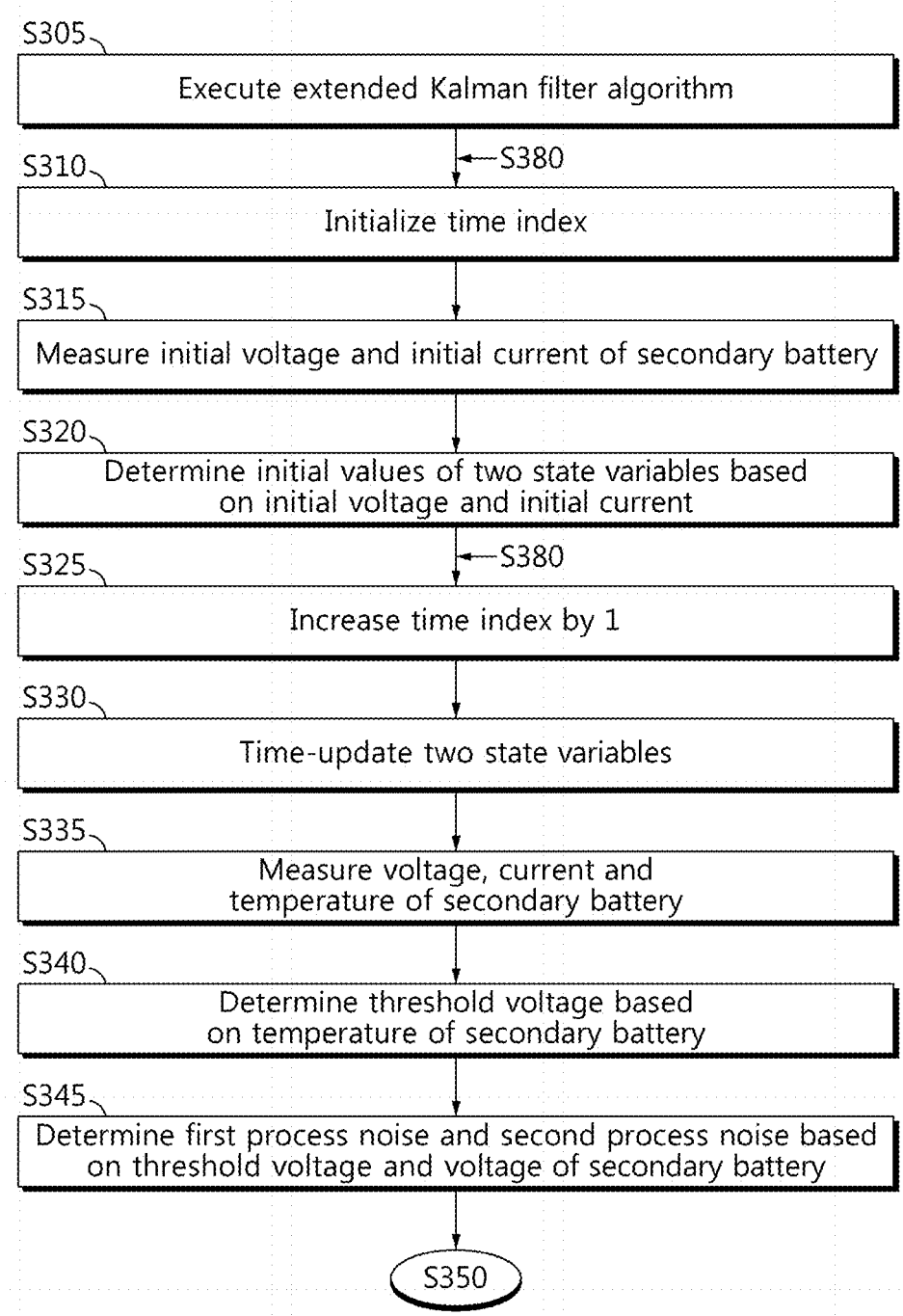
FIGS. 3 and 4 are flowcharts showing the sequence of a method for estimating the SOC of a secondary battery according to an embodiment of the present disclosure.
Figure 4:
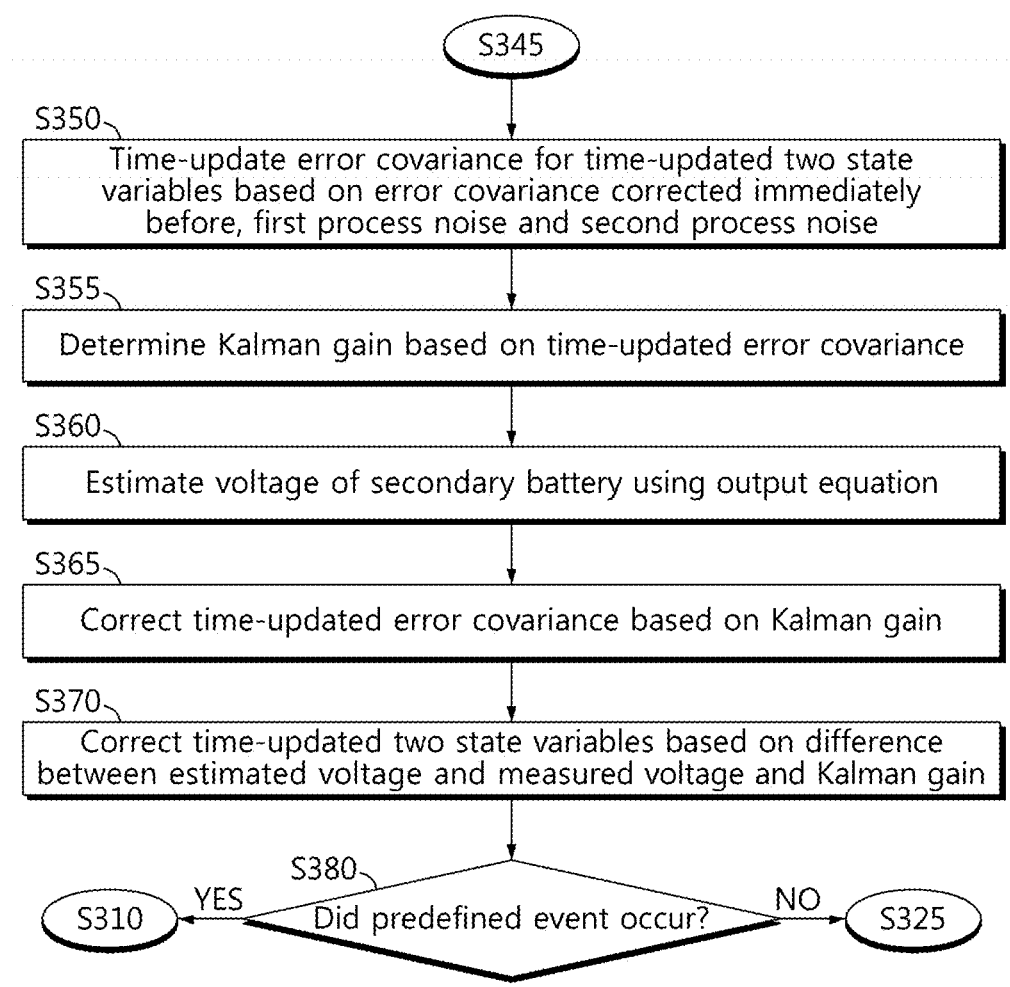

FIGS. 3 and 4 are flowcharts showing the sequence of the method for estimating the SOC of a secondary battery according to an embodiment of the present disclosure.

First, in step S305, the control unit 120 executes the extended Kalman filter algorithm according to the present disclosure.

Subsequently, in step S310, the control unit 120 initializes the time index k. Subsequently, in step S315, the control unit 120 measures initial voltage and initial current of the secondary battery B at the initialized time index k using the sensor unit 110. In this instance, the initial voltage and the initial current correspond to $V_{cell}[0]$ and $I[0]$ respectively. Subsequently, in step S320, the control unit 120 determines initial values of two state variables based on the initial voltage and the initial current. One of the two state variables is the SOC of the secondary battery B, and the other is the polarization voltage of the secondary battery B. The initialization method of the state variables is described above.

In step S325, the control unit 120 increases the time index k by 1. Subsequently, in step S330, the control unit 120 time-updates the two state variables using the state equation of the extended Kalman filter algorithm. In step S335, the control unit 120 measures the voltage, current and temperature of the secondary battery B using the sensor unit 110.

In step S340, the control unit 120 determines the threshold voltage based on the temperature of the secondary battery B measured by the sensor unit 110. In S345, the control unit 120 determines first process noise and second process noise based on the threshold voltage and the voltage of the secondary battery B measured by the sensor unit 110.

In step S350, the control unit 120 time-updates the error covariance for the time-updated two state variables based on the error covariance corrected immediately before, the first process noise and the second process noise. When the time index k=1, the error covariance corrected immediately before may be a preset initial value.

In step S355, the control unit 120 determines the Kalman gain based on the time-updated error covariance. In step S360, the control unit 120 estimates the voltage of the secondary battery B using the output equation of the extended Kalman filter algorithm. In S365, the control unit 120 corrects the time-updated error covariance based on the Kalman gain. In step S370, the control unit 120 corrects the time-updated two state variables based on a difference between the estimated voltage and the measured voltage and the Kalman gain. Here, one of the two state variables corrected by step S370 is a value estimated as the current SOC.

In step S380, the control unit 120 determines whether predefined event is occurred. When the result of step S380 is "YES", the method returns to step S310. When the result of step S380 is "NO", the method returns to step S325.

Accordingly, one cycle of the extended Kalman filter algorithm is completed by updating the SOC of the secondary battery B to the latest value. The detailed description of each step and equation that can be used in each step are described above and redundant descriptions are omitted.

Additionally, the control unit 120 may output the current SOC stored in the storage unit 140 to the external device through the communication interface 150.

At least one of the various control logics of the control unit 120 may be combined, and the combined control logics may be written in computer-readable coding systems and stored in computer-readable recording media. The recording media is not limited to a particular type and includes any type that can be accessed by the processor included in the computer. For example, the recording media may include at least one selected from the group consisting of ROM, RAM, register, CD-ROM, magnetic tape, hard disk, floppy disk and an optical data recording device. Additionally, the coding systems may be modulated to a carrier signal and included in a communication carrier at a specific point in time, and may be stored and executed in computers connected via a network in distributed manner. Additionally, functional programs, codes and segments for implementing the combined control logics may be easily inferred by programs in the technical field pertaining to the present disclosure.

Hereinafter, the process of setting the threshold voltage that is a parameter as a criterion for determining if the secondary battery B is in non-linear operating state will be described in detail with reference to FIGS. 5 to 7.

(a) of FIG. 5 is a graph showing discharge profiles obtained through constant current discharge experiments conducted while maintaining the temperature of six secondary batteries at 25° C. with the same maximum capacity of 36 Ah and different SOCs of 10%, 20%, 30%, 40% and 50%, (b) of FIG. 5 is a graph showing resistance variation profiles obtained from the discharge profiles shown in (a) of FIG. 5, FIG. 6 is a graph showing candidate voltage values determined from discharge profiles and resistance variation profiles obtained under various temperature conditions, and FIG. 7 is a graph showing changes in threshold voltage with changes in temperature condition.

For each of a plurality of preset temperature conditions, a plurality of discharge profiles may be obtained by conducting constant current discharge tests for each SOC, and (a) of FIG. 5 shows five discharge profiles obtained under the temperature condition of 25° C.

The magnitude of discharge current applied in each constant current discharge test is a threshold current value corresponding to the SOC and temperature of the secondary battery B. A threshold current value corresponding to a specific SOC and temperature may be determined through the Hybrid Pulse Power Characterization (HPPC) method or the like, and may be the maximum value of discharge current that does not damage the secondary battery B.

Preferably, when the maximum value of discharge current determined through the HPPC method at the specific SOC and temperature is greater than a given upper limit value of discharge current for safety of the secondary battery B, the threshold current value corresponding to the specific SOC and temperature may be set as being equal to the upper limit value of discharge current.

In the constant current discharge experiment conducted to obtain the discharge profiles shown in (a) of FIG. 5, the upper limit value of discharge current was set to 360 A. In (a) of FIG. 5, the threshold current values applied when obtaining each discharge profile are indicated on the right side of the graph. That is, the threshold current values corresponding to 20%, 30%, 40% and 50% SOC are equally 360 A. This is because the maximum value of discharge current determined through the HPPC method for the secondary batteries at 20%, 30%, 40% and 50% SOC under the temperature condition of 25° C. exceeds the upper limit value 360 A of discharge current. In contrast, as the maximum value 200 A of discharge current determined for the secondary battery at 10% SOC through the HPPC method under the temperature condition of 25° C. is lower than the upper limit value 360 A of discharge current, 200 A was applied as the threshold current value.

Each resistance variation profile may be obtained by applying the following Equation 11 for each discharge profile.

$$\frac{dR}{dt} = \frac{d\left(\frac{V(t) - OCV}{I_{TH}}\right)}{dt} \qquad \text{Equation 11}$$

In Equation 11, t may be the time, $I_{TH}$ may be the threshold current value corresponding to the specific SOC and temperature, V(t) may be the voltage of the secondary battery at t, and OCV may be OCV corresponding to the specific SOC and temperature of the secondary battery. $I_{TH}$ and OCV are a value given beforehand for the specific state of charge and temperature, and V(t) is a value that can be extracted from the discharge profile for the specific state of charge and temperature.

After time points at which each resistance variation profile reaches a preset threshold variation $R_{TH}$ are determined, voltage values of each discharge profile at the determined time points are recorded as candidate voltage values. Accordingly, for each temperature condition, a plurality of candidate voltage values may be recorded.

Referring to (a) and (b) of FIG. 5, five candidate voltage values related to each of discharge profiles obtained for each of five SOCs under the temperature condition of 25° C. may be recorded. In detail, referring to (b) of FIG. 5, five resistance variation profiles reach the threshold variation $R_{TH}$ at five time points $t_1, t_2, t_3, t_4$ and is in a sequential order. That is, when the threshold variation $R_{TH}$ is given, the time points at which each resistance variation profile reaches the threshold variation $R_{TH}$ may be determined. Subsequently, the voltages of each discharge profile shown in (a) of FIG. 5 at the five determined time points $t_1$, $t_2$, $t_3$, $t_4$ and is may be determined.

Referring to FIG. 6, candidate voltage values recorded under each of various temperature conditions of 45° C., 25° C., 10° C., 0° C., −10° C. are shown. To help understanding, candidate voltage values recorded under the same temperature condition were grouped by connecting them with a straight line in a sequential order. Referring to (a) and (b) of FIG. 5 together, the candidate voltage value at the time point $t_3$ is the highest among the five candidate voltage values determined under the temperature condition of 25° C. Accordingly, under the temperature condition of 25° C., the candidate voltage value at the time point $t_3$ may be set as the threshold voltage.

In the same way, threshold voltages for each of the remaining temperature conditions 45° C., 10° C., 0° C. and −10° C. shown in FIG. 6 may be set, and this can be seen through FIG. 7. As shown in FIG. 7, the threshold voltage may tend to increase as the temperature increases. The threshold voltages for temperatures other than the temperatures used in the constant current discharge experiment may be set using interpolation or the like.

The operation of setting the threshold voltages for each temperature condition described above with reference to FIGS. 5 to 7 may be performed by the control unit 120. That is, when at least one discharge profile for a specific temperature condition is provided from the storage unit 140 or the like, the control unit 120 may determine time points at which resistance variation profiles corresponding to each discharge profile reach the threshold variation $R_{TH}$, record voltages of each discharge profile at the determined time points as candidate voltage values, and set any one of the candidate voltage values recorded under the same temperature condition as the threshold voltage for the specific temperature condition. Of course, the threshold voltages for each temperature condition may be pre-stored in the storage unit 140 in the form of a lookup table. When a signal indicating the temperature of the secondary battery B transmitted from the sensor unit 110 is abnormal, the control unit 120 may set the threshold voltage for the highest temperature among a plurality of temperature conditions from a plurality of threshold voltages.

In describing various embodiments of the present disclosure, it should be understood that the components designated by '~ unit' are elements which are classified functionally rather than physically. Accordingly, each component may be selectively combined with other component, or may be divided into subcomponents for efficient execution of control logic(s). However, it is obvious to those skilled in the art that even though the components are combined or divided, if the sameness of functions is acknowledged, the combined or divided components should be construed as being in the scope of the present disclosure.

While the present disclosure has been hereinabove described with regard to a limited number of embodiments and drawings, the present disclosure is not limited thereto and it should be understood that various modifications and changes may be made by those skilled in the art within the technical aspects of the invention and the equivalent scope of the appended claims.

REFERENCE SIGNS

B: secondary battery
100: apparatus for estimating the state of charge
110: sensor unit
120: control unit
130: load
140: storage unit
150: communication interface
200: equivalent circuit model

What is claimed is:

1. An apparatus for estimating a state of charge of a secondary battery, comprising:
   a sensor unit configured to measure a voltage and a current of the secondary battery in a predetermined cycle; and
   a control unit operably coupled to the sensor unit, the control unit being configured to:
      estimate the state of charge of the secondary battery in the predetermined cycle based on the voltage and the current measured by the sensor unit by repeatedly executing an extended Kalman filter algorithm using:
         a state equation related to a current integration model and an equivalent circuit model; and
         an output equation related to the equivalent circuit model;
      determine an operating state of the secondary battery as any one of a linear operating state and a non-linear operating state based on a threshold voltage and the measured voltage; and
      determine a first process noise indicating inaccuracy of the current integration model and a second process noise indicating inaccuracy of the equivalent circuit model according to the determined operating state.

2. The apparatus according to claim 1, wherein the control unit is further configured to set the first process noise to a first fixed value and the second process noise to a second fixed value when the operating state of the secondary battery is determined as the linear operating state.

3. The apparatus according to claim 2, wherein:
   the control unit is further configured to set the first process noise to the first fixed value and the second process noise to a first corrected value when the operating state of the secondary battery is determined as the non-linear operating state; and
   the first corrected value is larger than the second fixed value.

4. The apparatus according to claim 3, wherein the control unit is further configured to determine the first corrected value based on a difference between the measured voltage and the threshold voltage.

5. The apparatus according to claim 2, wherein:
   the control unit is further configured to set the first process noise to a second corrected value and the second process noise to the second fixed value when the operating state of the secondary battery is determined as the non-linear operating state; and
   the second corrected value is smaller than the first fixed value.

6. The apparatus according to claim 5, wherein the control unit is further configured to determine the second corrected value based on a difference between the measured voltage and the threshold voltage.

7. The apparatus according to claim 2, wherein:
   the control unit is further configured to set the first process noise to a third corrected value and the second process noise to a fourth corrected value when the operating state of the secondary battery is determined as the non-linear operating state;
   the third corrected value is smaller than the first fixed value; and the fourth corrected value is larger than the second fixed value.

8. The apparatus according to claim 7, wherein the control unit is further configured to determine the third corrected value and the fourth corrected value based on a difference between the measured voltage and the threshold voltage.

9. The apparatus according to claim 1, further comprising a communication interface configured to transmit data to an external device, the data indicating the state of charge of the secondary battery repeatedly estimated by the control unit.

10. The apparatus according to claim 1, wherein:
the sensor unit is further configured to measure a temperature of the secondary battery in the predetermined cycle; and
the control unit is further configured to:
determine the threshold voltage based on the measured temperature, the threshold voltage being a criterion for distinguishing between the linear operating state and the non-linear operating state;
determine the operating state of the secondary battery as the linear operating state when the measured voltage is higher than the threshold voltage; and
determine the operating state of the secondary battery as the non-linear operating state when the measured voltage is lower than the threshold voltage.

11. A method for estimating a state of charge of a secondary battery, comprising:
measuring, by a sensor unit, a voltage and a current of the secondary battery in a predetermined cycle;
estimating, by a control unit operably coupled to the sensor unit, the state of charge of the secondary battery in the predetermined cycle based on the voltage and the current measured by the sensor unit by repeatedly executing an extended Kalman filter algorithm using:
a state equation related to a current integration model and an equivalent circuit model; and
an output equation related to the equivalent circuit model;
determining, by the control unit, an operating state of the secondary battery as any one of a linear operating state and a non-linear operating state based on a threshold voltage and the measured voltage; and
determining, by the control unit, a first process noise indicating inaccuracy of the current integration model and a second process noise indicating inaccuracy of the equivalent circuit model according to the determined operating state.

12. The method of claim 11, wherein the control unit is further configured to set the first process noise to a first fixed value and the second process noise to a second fixed value when the operating state of the secondary battery is determined as the linear operating state.

13. The method of claim 12, further comprising:
setting, by the control unit, the first process noise to the first fixed value and the second process noise to a first corrected value when the operating state of the secondary battery is determined as the non-linear operating state,
wherein the first corrected value is larger than the second fixed value.

14. The method of claim 13, further comprising determining, by the control unit, the first corrected value based on a difference between the measured voltage and the threshold voltage.

15. The method of claim 12, further comprising:
setting, by the control unit, the first process noise to a second corrected value and the second process noise to the second fixed value when the operating state of the secondary battery is determined as the non-linear operating state,
wherein the second corrected value is smaller than the first fixed value.

16. The method of claim 15, further comprising determining, by the control unit, the second corrected value based on a difference between the measured voltage and the threshold voltage.

17. The method of claim 12, further comprising:
setting, by the control unit, the first process noise to a third corrected value and the second process noise to a fourth corrected value when the operating state of the secondary battery is determined as the non-linear operating state,
wherein the third corrected value is smaller than the first fixed value, and
wherein the fourth corrected value is larger than the second fixed value.

18. The method of claim 11, further comprising transmitting, by a communication interface, data to an external device, the data indicating the state of charge of the secondary battery repeatedly estimated by the control unit.

19. The method of claim 11, further comprising:
measuring, by the sensor unit, a temperature of the secondary battery in the predetermined cycle;
determining, by the control unit, the threshold voltage based on the measured temperature, the threshold voltage being a criterion for distinguishing between the linear operating state and the non-linear operating state;
determining, by the control unit, the operating state of the secondary battery as the linear operating state when the measured voltage is higher than the threshold voltage; and
determining, by the control unit, the operating state of the secondary battery as the non-linear operating state when the measured voltage is lower than the threshold voltage.

\* \* \* \* \*